(12) United States Patent
Mitani et al.

(10) Patent No.: US 8,823,567 B2
(45) Date of Patent: Sep. 2, 2014

(54) RESONATOR, DELTA-SIGMA MODULATOR, AND WIRELESS COMMUNICATION DEVICE

(75) Inventors: Yosuke Mitani, Osaka (JP); Kazuo Matsukawa, Osaka (JP); Masao Takayama, Osaka (JP); Koji Obata, Osaka (JP); Shiro Dosho, Osaka (JP)

(73) Assignee: Panasonic Corporation, Osaka (JP)

( * ) Notice: Subject to any disclaimer, the term of this patent is extended or adjusted under 35 U.S.C. 154(b) by 310 days.

(21) Appl. No.: 13/534,716

(22) Filed: Jun. 27, 2012

(65) Prior Publication Data

US 2012/0262320 A1   Oct. 18, 2012

Related U.S. Application Data

(63) Continuation of application No. PCT/JP2010/004480, filed on Jul. 9, 2010.

(30) Foreign Application Priority Data

Jan. 20, 2010   (JP) ................................. 2010-010023

(51) Int. Cl.
 *H03M 3/00*   (2006.01)
 *H03H 11/04*  (2006.01)

(52) U.S. Cl.
 CPC ....... *H03H 11/04* (2013.01); *H03H 2011/0488* (2013.01); *H03M 3/404* (2013.01)
 USPC .......................................... 341/143; 341/145

(58) Field of Classification Search
 CPC .......... H03H 11/04; H03H 2011/0488; H03M 3/404
 USPC ........... 341/143, 144, 145; 327/554; 333/187, 333/200
 See application file for complete search history.

(56) References Cited

U.S. PATENT DOCUMENTS

| | | | |
|---|---|---|---|
| 4,509,037 A | 4/1985 | Harris | |
| 4,553,103 A | 11/1985 | Rollett | |
| 6,897,743 B2 * | 5/2005 | Kawashima | 333/187 |
| 7,412,764 B2 * | 8/2008 | Kawashima | 29/594 |
| 7,564,326 B2 * | 7/2009 | Kawashima | 333/200 |

FOREIGN PATENT DOCUMENTS

| | | |
|---|---|---|
| JP | 53-88549 | 8/1978 |
| JP | 62-183209 | 8/1987 |
| WO | WO 2009/133653 A1 | 11/2009 |
| WO | WO 2010/038331 A1 | 4/2010 |

OTHER PUBLICATIONS

International Search Report issued in International Patent Application No. PCT/JP2010/004480 dated Oct. 12, 2010.
S.R. Norsworthy et al., "Delta-Sigma Data Converters, Theory, Design, and Simulation," IEEE Press 1997.
H. Inose et al., "A Unity Bit Coding Method by Negative Feedback," Proceedings of the IEEE, pp. 1524-1535, Nov. 1963.

* cited by examiner

*Primary Examiner* — Jean B Jeanglaude
(74) *Attorney, Agent, or Firm* — McDermott Will & Emery LLP

(57) ABSTRACT

Two T filters, one of which includes two resistive elements and one capacitive element and the other of which includes two capacitive elements and one resistive element, are inserted in a negative-feedback section of an operational amplifier, and a resistive element and a capacitive element are connected between each of intermediate nodes and a signal input terminal. A resistive element and a capacitive element which are connected to each other in parallel are connected between the signal input terminal and an inverting input terminal of the operational amplifier. With this configuration, overall admittances where elements connected to the corresponding intermediate nodes are in parallel connection are equal to each other.

10 Claims, 5 Drawing Sheets

RESONATOR, DELTA-SIGMA MODULATOR, AND WIRELESS COMMUNICATION DEVICE

CROSS-REFERENCE TO RELATED APPLICATION

This is a continuation of PCT International Application PCT/JP2010/004480 filed on Jul. 9, 2010, which claims priority to Japanese Patent Application No. 2010-010023 filed on Jan. 20, 2010. The disclosures of these applications including the specifications, the drawings, and the claims are hereby incorporated by reference in their entirety.

BACKGROUND

The present disclosure relates to resonators, and specifically to resonators suitable for delta-sigma modulators.

In general, it is known that delta-sigma modulators used in analog-to-digital converters (ADCs) are capable of providing high accuracy and low power consumption by a noise shaping technique and an oversampling technique compared to Nyquist analog-to-digital converters. Among the delta-sigma modulators, continuous-time delta-sigma modulators are technically suitable for high-speed wide-band delta-sigma modulators. In a general continuous-time delta-sigma modulator, an input signal passes through cascade-connected n analog integrators, and then is quantized by a quantizer, an output of which is fed back by n digital-to-analog converters (DACs) (for example, see the following two references: Steven R. Norsworthy, Richard Schereier and Gabor C. Temes, "Delta-Sigma Data Converters Theory, Design and Simulation," IEEE press 1997; H. Inose, Y. Yasuda, "A unity bit Coding Method by Negative Feedback," Proceedings of the IEEE, November 1963).

In general, in order to improve the conversion accuracy of a delta-sigma modulator, the order of a loop filter has to be increased to remove quantization noise. In order to increase the order of the loop filter, integrators the number of which corresponds to the order of the loop filter may be cascade-connected. However, this requires many operational amplifiers, which may increase power consumption and the chip area. For this reason, the delta-sigma modulator preferably uses a resonator which achieves a multi-order transfer function with one operational amplifier. In a known example of such a resonator, a CR series circuit is connected to an inverting input terminal of an operational amplifier, and a twin T notch filter and another CR series circuit are inserted into a negative-feedback section of the operational amplifier (for example, see Japanese Patent Publication No. S62-183209).

SUMMARY

In such a conventional resonator, a capacitive element in the CR series circuit inserted into the negative-feedback section of the operational amplifier is connected to an output terminal of the operational amplifier. Thus, the capacitive element serves as an output load, which may increase power consumption of the operational amplifier. Moreover, in order to use the resonator in a delta-sigma modulator, a mechanism is necessary to discharge the capacitive element included in the resonator.

The present invention is advantageous in reducing power consumption of a resonator having second-order transfer characteristics with one operational amplifier, and in allowing transfer characteristics of the resonator to be easily changed.

An example resonator according to the present invention includes: an operational amplifier; a first resistive element connected between a first node and an inverting input terminal of the operational amplifier; a second resistive element connected between the first node and a non-inverting output terminal of the operational amplifier; a first capacitive element connected between a second node and the inverting input terminal of the operational amplifier; a second capacitive element connected between the second node and the non-inverting output terminal of the operational amplifier; a third capacitive element connected between the first node and a third node; a third resistive element connected between the second node and the third node; a fourth resistive element connected between the first node and a signal input terminal; and a fifth capacitive element connected between the signal input terminal and the inverting input terminal of the operational amplifier. Here, an overall admittance where elements connected to the first node are in parallel connection is equal to an overall admittance where elements connected to the second node are in parallel connection. The above-described resonator may further include at least one of a fifth resistive element connected between the signal input terminal and the inverting input terminal of the operational amplifier; or a fourth capacitive element connected between the second node and the signal input terminal.

Another example resonator of the present invention includes: an operational amplifier; a first resistive element connected between a first node and an inverting input terminal of the operational amplifier; a second resistive element connected between the first node and a non-inverting output terminal of the operational amplifier; a first capacitive element connected between a second node and the inverting input terminal of the operational amplifier; a second capacitive element connected between the second node and the non-inverting output terminal of the operational amplifier; a third capacitive element connected between the first node and a third node; a third resistive element connected between the second node and the third node; a fourth capacitive element connected between the second node and a signal input terminal; and a fifth resistive element connected between the signal input terminal and the inverting input terminal of the operational amplifier. Here, an overall admittance where elements connected to the first node are in parallel connection is equal to an overall admittance where elements connected to the second node are in parallel connection. The above-described resonator may further include at least one of a fifth capacitive element connected between the signal input terminal and the inverting input terminal of the operational amplifier, or a fourth resistive element connected between the first node and the signal input terminal.

The negative-feedback section of the operational amplifier of each of the above-described resonators includes no CR series circuit serving as an output load, so that power consumption can be lowered compared to conventional configurations. Moreover, coefficients of the transfer function can be changed independently of each other, so that it is possible to easily set and change the transfer characteristics of the resonator.

Each of the above-described resonators may further include: a switch circuit configured to short-circuit the inverting input terminal of the operational amplifier, the non-inverting output terminal of the operational amplifier, and the third node. With this configuration, the capacitive elements included in the resonator are discharged by short-circuiting the above-described terminals and node by the switch circuit. Thus, this configuration is suitable for delta-sigma modulators, etc.

With the resonator according to each configuration of the present invention, it is possible to reduce power consumption of a resonator having second-order transfer characteristics with one operational amplifier. Moreover, the transfer characteristics of the resonator can be easily changed, so that it is possible to reduce manufacturing variations, increase manufacturing yield, and reduce cost.

DETAILED DESCRIPTION

Embodiment of Resonator

Figure 1:
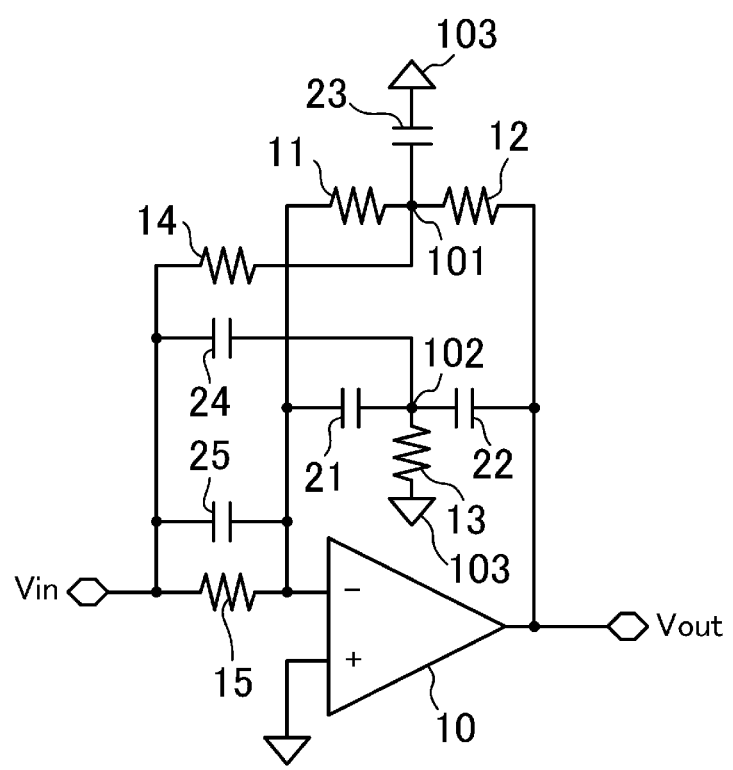
FIG. 1 is a schematic diagram of a resonator according to an embodiment of the present invention.

FIG. 1 illustrates a configuration of a resonator according to an embodiment of the present invention. The resonator according to the present embodiment includes an operational amplifier 10 having a non-inverting input terminal connected to ground, and a twin T notch filter inserted between an output terminal and an inverting input terminal of the operational amplifier 10. An output of the operational amplifier 10 is an output signal Vout of the resonator. The twin T notch filter is composed of a first T filter and a second T filter. The first T filter includes resistive elements 11, 12, and a capacitive element 23. The second T filter includes capacitive elements 21, 22, and a resistive element 13. One end of the resistive element 13 and one end of the capacitive element 23 are connected to a common node 103. A signal Vin is input to an intermediate node 101 of the first T filter via a resistive element 14, and the signal Vin is input to an intermediate node 102 of the second T filter via a capacitive element 24. Moreover, the signal Vin is input to the non-inverting input terminal of the operational amplifier 10 via a resistive element 15 and a capacitive element 25 which are connected to each other in parallel.

In this embodiment, when the resistance values of the resistive elements 11-15 are respectively $R_1$, $R_2$, $R_3$, $R_4$, and $R_5$, and the capacitance values of the capacitive elements 21-25 are respectively $C_1$, $C_2$, $C_3$, $C_4$, and $C_5$, the resonance condition is represented as follows.

$$1/R_3 = 1/R_1 + 1/R_2 + 1/R_4 \text{ and } C_3 = C_1 + C_2 + C_4$$

That is, the resonance condition is that an overall admittance where elements connected to the intermediate node 101 are in parallel connection is equal to an overall admittance where elements connected to the intermediate node 102 are in parallel connection. Moreover, the transfer function is represented by the following equation.

$$\frac{Vout}{Vin} = \frac{C_1 C_4 + C_3 C_5}{C_1 C_2} \times \frac{s^2 + \frac{1}{C_1 C_4 + C_3 C_5}\left(\frac{C_5}{R_3} + \frac{C_3}{R_5}\right)}{s^2 + \frac{1}{C_1 C_2 R_1 R_2}} \quad \text{[Equation 1]}$$

where s is the Laplace operator.

In the transfer function, all coefficients of the denominator terms and the numerator terms can be set independently of each other. Moreover, a zero point of the filter which is dependent on the numerator terms can be set by element values $C_4$, $C_5$, $R_4$, $R_5$ independently of the pole expressed by the denominator terms. That is, the resonator according to the present embodiment can provide second-order transfer characteristics by using one operational amplifier, and can arbitrarily change frequency characteristics without changing the transfer characteristics.

(Variation)

Figure 2:
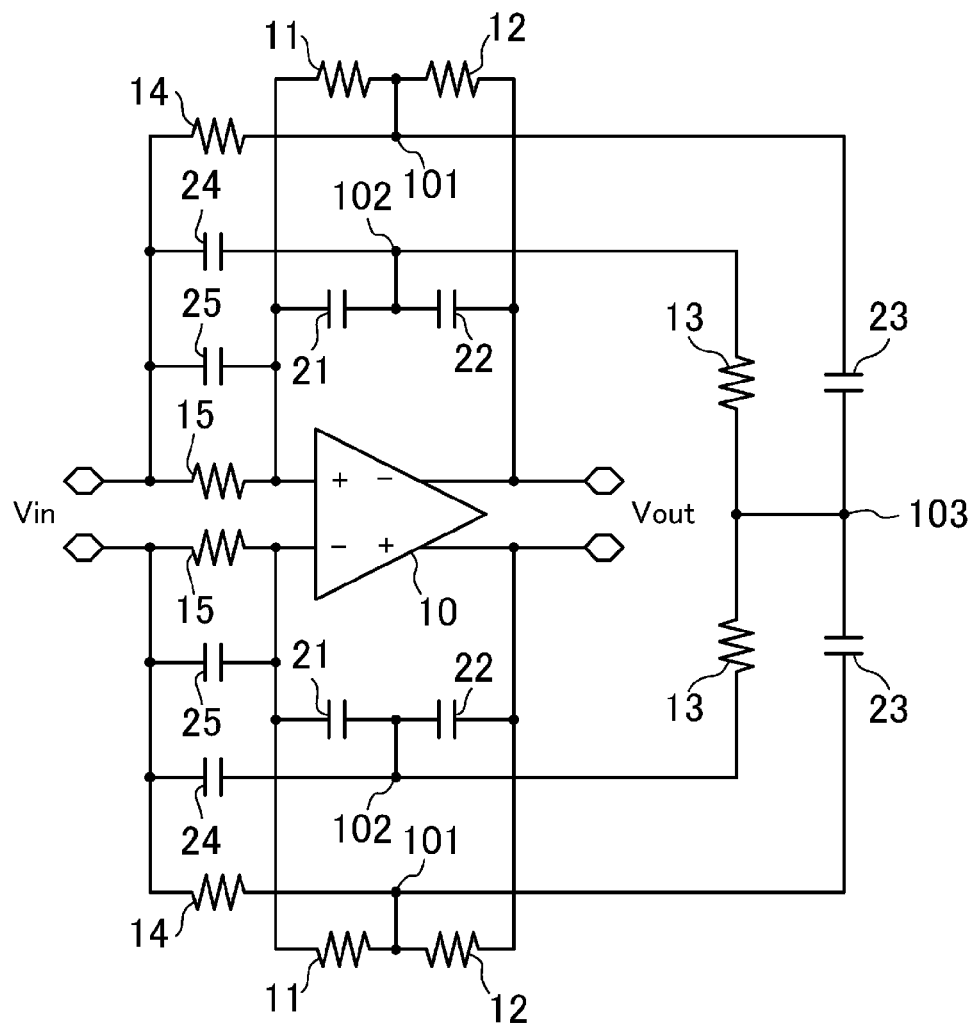
FIG. 2 is a schematic diagram of a resonator having a differential configuration.
Figure 3:
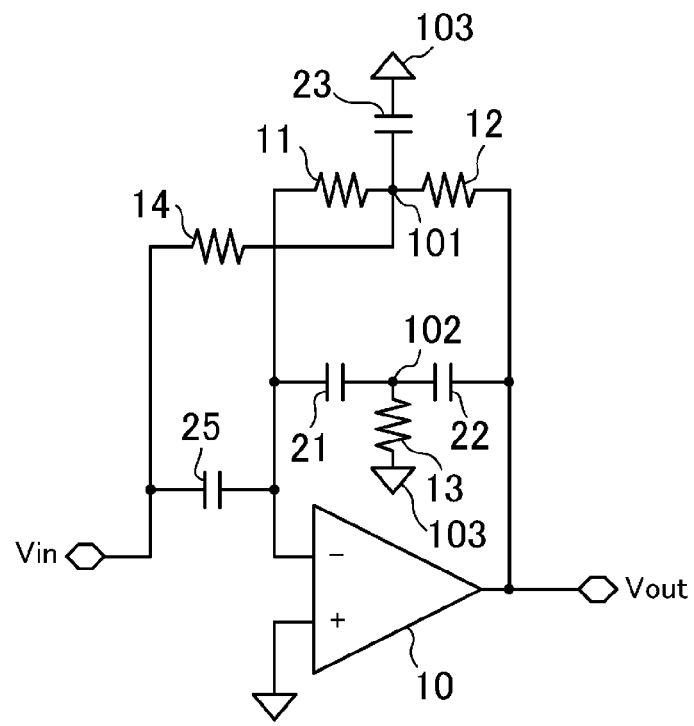
FIG. 3 is a schematic diagram of a resonator according to a variation.

As illustrated in FIG. 2, the resonator of FIG. 1 may be modified to have a differential configuration. Moreover, any of the resistive elements 14, 15 and the capacitive elements 24, 25 may be omitted. FIG. 3 illustrates a resonator obtained by omitting the resistive element 15 and the capacitive element 24 from the resonator of FIG. 1. The resonance condition of this case is represented as follows.

$$1/R_3 = 1/R_1 + 1/R_2 + 1/R_4 \text{ and } C_3 = C_1 + C_2$$

The transfer function is represented by the following equation.

$$\frac{Vout}{Vin} = \frac{C_3 C_5 s^2 + \frac{C_5}{R_3}s + \frac{1}{R_1 R_4}}{C_1 C_2 s^2 + \frac{1}{R_1 R_2}} \quad \text{[Equation 2]}$$

Also in this transfer function, all coefficients of the denominator terms and the numerator terms can be set independently of each other. Moreover, a zero point of the filter which depends on the numerator terms can be set by element values $C_5$, $R_4$ independently from the pole expressed by the denominator terms.

Figure 4:
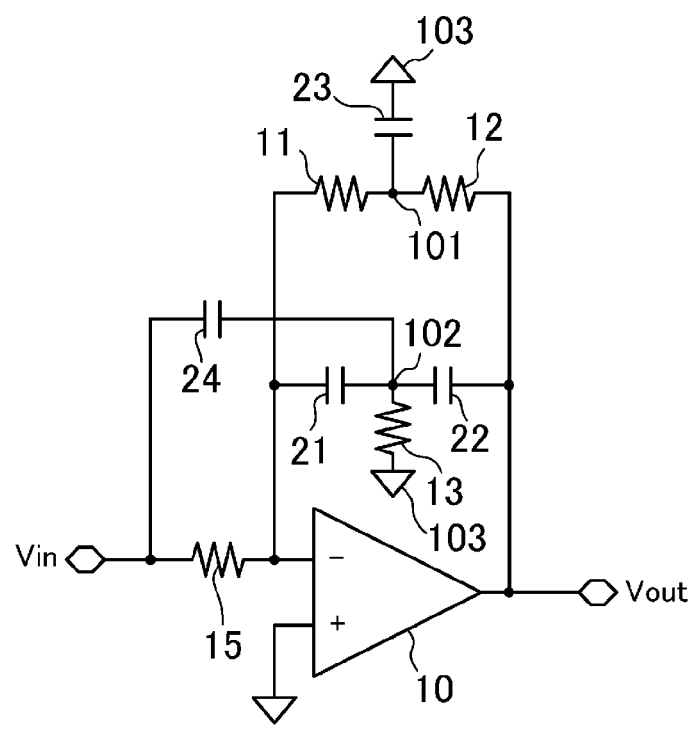
FIG. 4 is a schematic diagram of a resonator according to another variation.

FIG. 4 illustrates a resonator obtained by omitting the resistive element 14 and the capacitive element 25 from the resonator of FIG. 1. The resonance condition of this case is represented as follows.

$$1/R_3 = 1/R_1 + 1/R_2 \text{ and } C_3 = +C_2 + C_4$$

The transfer function is represented by the following equation.

$$\frac{Vout}{Vin} = \frac{C_1 C_4 s^2 + \frac{C_3}{R_5}s + \frac{1}{R_3 R_5}}{C_1 C_2 s^2 + \frac{1}{R_1 R_2}} \quad \text{[Equation 3]}$$

Also in this transfer function, all coefficients of the denominator terms and the numerator terms can be set independently of each other. Moreover, a zero point of the filter which depends on the numerator terms can be set by the element values $C_4$, $R_5$ independently of the pole expressed by the denominator terms.

Embodiment of Delta-Sigma Modulator

Figure 5:
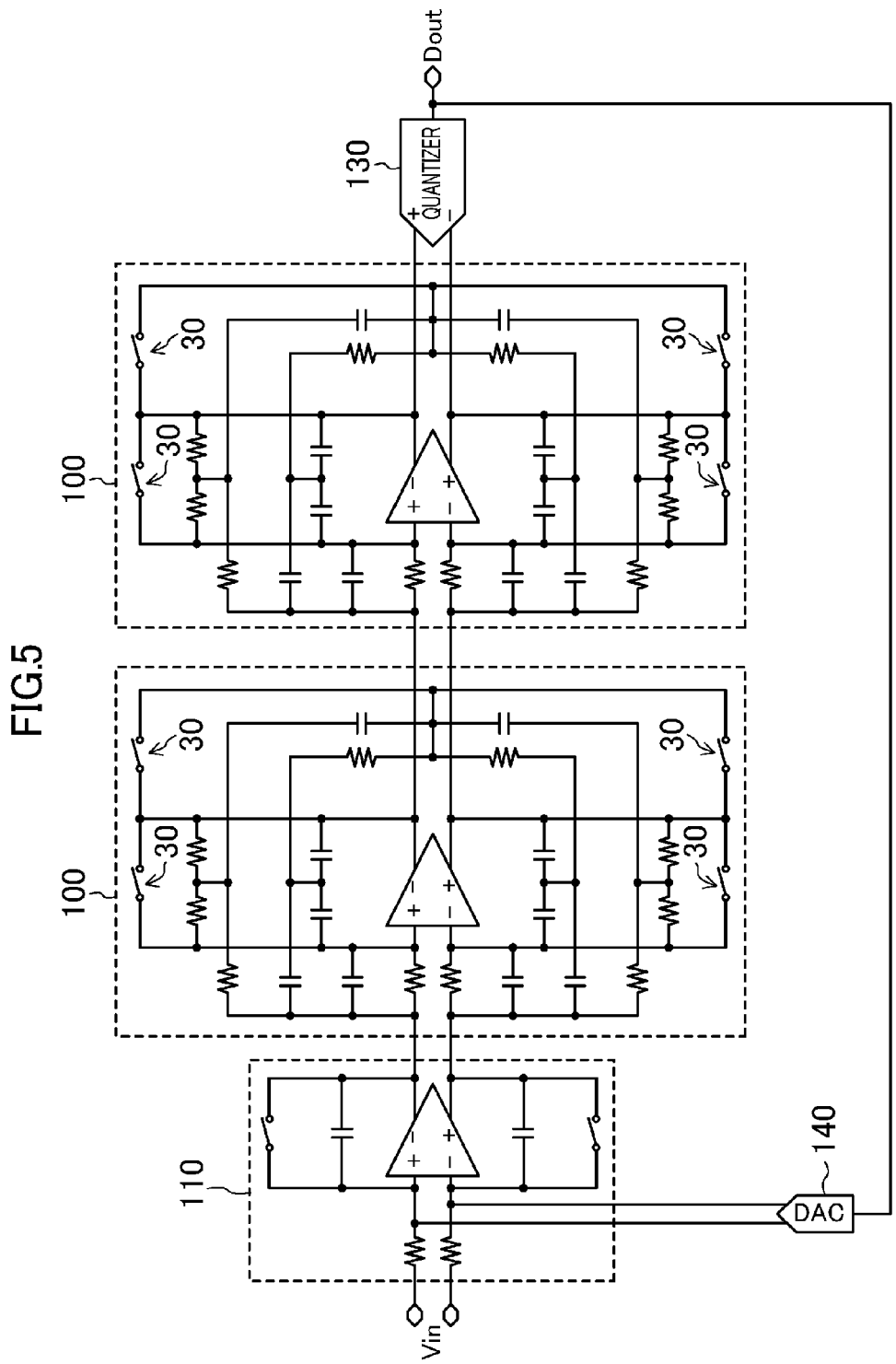
FIG. 5 is a schematic diagram of a delta-sigma modulator according to an embodiment of the present invention.

FIG. 5 illustrates a configuration of a delta-sigma modulator according to an embodiment of the present invention. The delta-sigma modulator according to the present embodiment includes a fifth-order loop filter formed by cascade-connecting two second-order resonators 100 downstream of a first-order integrator 110 having a differential configuration, a quantizer 130 for quantizing the output of the loop filter, and a digital-to-analog converter 140 for feeding an output Dout of the quantizer 130 back to the first-order integrator 100.

Each resonator 100 is the resonator of FIG. 2 further including switch circuits 30 which allow input/output terminals of the operational amplifier 10 which are different from each other in polarity and a common node 103 to be shorted. The switch circuits 30 are open in normal operation of the resonator 100, but for example, when an excessively amplified signal is input to oscillate the resonator 100, the switch circuits 30 are closed to discharge the capacitive elements 21-25 included in the resonator 100.

Embodiments of Wireless Communication Device

Figure 6:
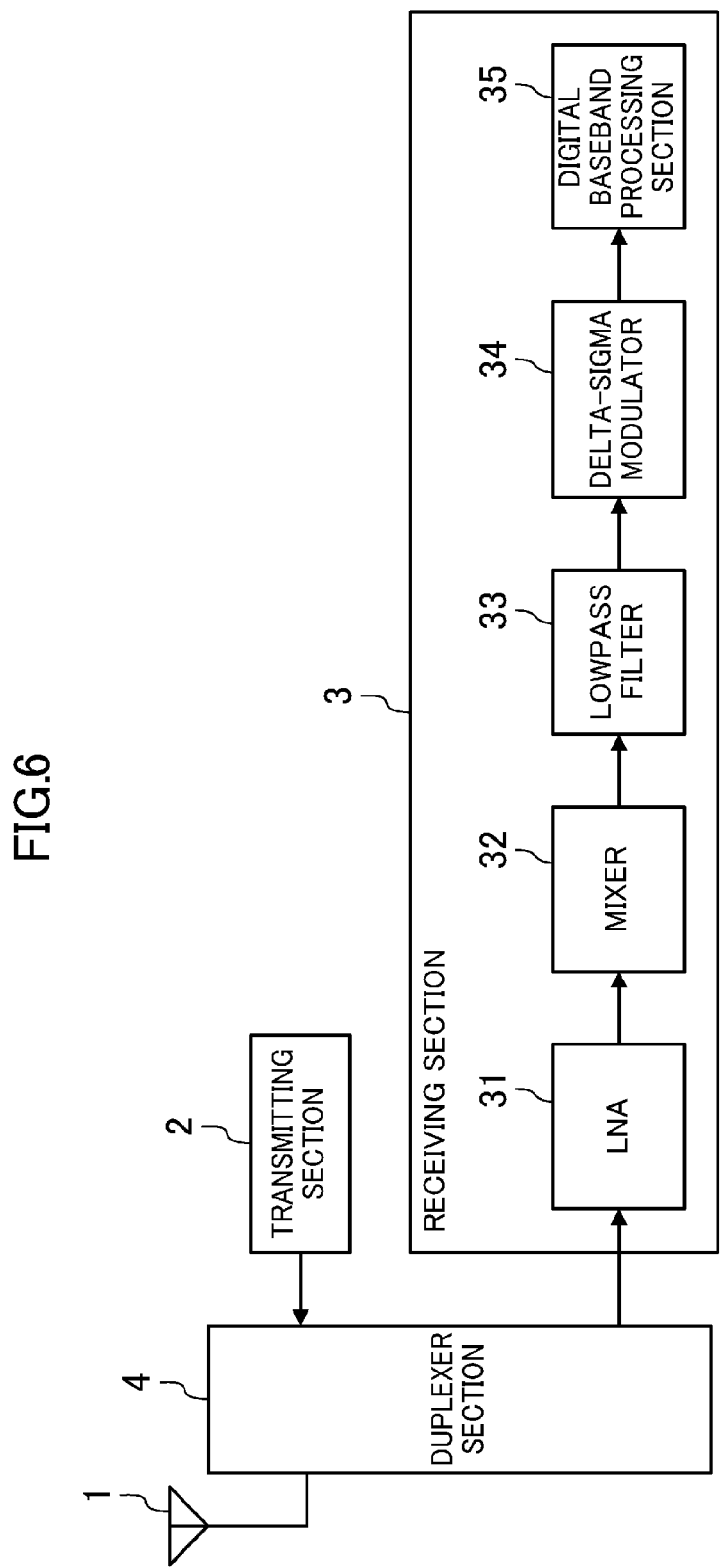
FIG. 6 is a block diagram of a wireless communication device according to an embodiment of the present invention.

FIG. 6 illustrates a configuration of a wireless communication device according to an embodiment of the present invention. The wireless communication device according to the present embodiment includes an antenna 1 for transmitting and receiving radio waves, a transmitting section 2 for performing predetermined transmitting processes including a modulation process on a transmitting signal, a receiving section 3 for performing predetermined receiving processes including a decoding process on a received signal, and a duplexer section 4 for switching between the transmitting signal and the received signal. Specifically, the receiving section 3 includes a low-noise amplifier (LNA) 31, a mixer 32, a lowpass filter 33, a delta-sigma modulator 34, and a digital baseband processing section 35. As the delta-sigma modulator 34, the delta-sigma modulator of FIG. 5 may be used. With this configuration, a low-cost highly accurate wireless communication device with low power consumption can be obtained.

The resonator according to the present invention has low power consumption, and transfer characteristics of the resonator is easily changed, and additionally, the resonator has the function of discharging the capacitive element. Thus, the resonator according to the present invention is useful for electronic devices such as delta-sigma modulators, wireless communication devices, data converter circuits, audio equipment, video equipment, or the like.

What is claimed is:

1. A resonator comprising:
an operational amplifier;
a first resistive element connected between a first node and an inverting input terminal of the operational amplifier;
a second resistive element connected between the first node and a non-inverting output terminal of the operational amplifier;
a first capacitive element connected between a second node and the inverting input terminal of the operational amplifier;
a second capacitive element connected between the second node and the non-inverting output terminal of the operational amplifier;
a third capacitive element connected between the first node and a third node;
a third resistive element connected between the second node and the third node;
a fourth resistive element connected between the first node and a signal input terminal; and
a fifth capacitive element connected between the signal input terminal and the inverting input terminal of the operational amplifier, wherein
an overall admittance where elements connected to the first node are in parallel connection is equal to an overall admittance where elements connected to the second node are in parallel connection.

2. The resonator of claim 1, further comprising at least one of
a fifth resistive element connected between the signal input terminal and the inverting input terminal of the operational amplifier; or
a fourth capacitive element connected between the second node and the signal input terminal.

3. A resonator comprising:
an operational amplifier;
a first resistive element connected between a first node and an inverting input terminal of the operational amplifier;
a second resistive element connected between the first node and a non-inverting output terminal of the operational amplifier;
a first capacitive element connected between a second node and the inverting input terminal of the operational amplifier;
a second capacitive element connected between the second node and the non-inverting output terminal of the operational amplifier;
a third capacitive element connected between the first node and a third node;
a third resistive element connected between the second node and the third node;
a fourth capacitive element connected between the second node and a signal input terminal; and
a fifth resistive element connected between the signal input terminal and the inverting input terminal of the operational amplifier, wherein
an overall admittance where elements connected to the first node are in parallel connection is equal to an overall admittance where elements connected to the second node are in parallel connection.

4. The resonator of claim 3, further comprising at least one of
a fifth capacitive element connected between the signal input terminal and the inverting input terminal of the operational amplifier, or
a fourth resistive element connected between the first node and the signal input terminal.

5. The resonator of claim 1, further comprising:
a switch circuit configured to short-circuit the inverting input terminal of the operational amplifier, the non-inverting output terminal of the operational amplifier, and the third node.

6. The resonator of claim 3, further comprising:
a switch circuit configured to short-circuit the inverting input terminal of the operational amplifier, the non-inverting output terminal of the operational amplifier, and the third node.

7. A delta-sigma modulator comprising:
the resonator of claim 5; and
a quantizer configured to quantize an output of the resonator.

8. A delta-sigma modulator comprising:
the resonator of claim 6; and
a quantizer configured to quantize an output of the resonator.

9. A wireless communication device comprising:
the delta-sigma modulator of claim 7; and
a digital baseband processing section configured to process an output of the delta-sigma modulator.

10. A wireless communication device comprising:
the delta-sigma modulator of claim 8; and
a digital baseband processing section configured to process an output of the delta-sigma modulator.

* * * * *